United States Patent
Morimoto et al.

(10) Patent No.: US 8,802,540 B2
(45) Date of Patent: Aug. 12, 2014

(54) METHOD OF MANUFACTURING BONDED WAFER

(75) Inventors: Nobuyuki Morimoto, Yamagata (JP); Akihiko Endo, Yamagata (JP)

(73) Assignee: Sumco Corporation, Tokyo (JP)

( * ) Notice: Subject to any disclaimer, the term of this patent is extended or adjusted under 35 U.S.C. 154(b) by 1578 days.

(21) Appl. No.: 11/955,765

(22) Filed: Dec. 13, 2007

(65) Prior Publication Data

US 2008/0227271 A1 Sep. 18, 2008

(30) Foreign Application Priority Data

Mar. 14, 2007 (JP) .................. 2007-064482

(51) Int. Cl.
*H01L 21/30* (2006.01)
(52) U.S. Cl.
USPC ............ 438/459; 257/E21.122; 257/E21.211; 257/E21.569
(58) Field of Classification Search
CPC ................ H01L 21/2007; H01L 21/31654; H01L 21/76251
USPC .................. 257/618–628, E21.122–E21.128, 257/E21.567–E21.57; 148/33–33.3; 428/428, 441, 446, 448, 450
See application file for complete search history.

(56) References Cited

U.S. PATENT DOCUMENTS

| | | | | |
|---|---|---|---|---|
| 5,232,870 A * | 8/1993 | Ito et al. | ......... | 438/455 |
| 5,744,852 A * | 4/1998 | Linn et al. | ......... | 257/618 |
| 6,230,720 B1 | 5/2001 | Yalamanchili et al. | | |
| 6,255,149 B1 | 7/2001 | Bensahel et al. | | |
| 6,312,797 B1 * | 11/2001 | Yokokawa et al. | ......... | 438/455 |
| 6,319,331 B1 | 11/2001 | Kume et al. | | |
| 6,492,283 B2 * | 12/2002 | Raaijmakers et al. | ......... | 438/770 |
| 2004/0108575 A1 * | 6/2004 | Ohmi et al. | ......... | 257/627 |
| 2004/0195656 A1 | 10/2004 | Ghyselen et al. | | |
| 2004/0209441 A1 | 10/2004 | Maleville et al. | | |
| 2005/0079712 A1 | 4/2005 | Tong et al. | | |
| 2006/0073644 A1 | 4/2006 | Atoji et al. | | |
| 2006/0154442 A1 | 7/2006 | de Souza et al. | | |
| 2007/0184631 A1 | 8/2007 | Nakamura et al. | | |
| 2007/0190737 A1 | 8/2007 | Morimoto et al. | | |
| 2007/0287205 A1 | 12/2007 | Kubota | | |

FOREIGN PATENT DOCUMENTS

| | | |
|---|---|---|
| EP | 0676796 | 10/1995 |
| JP | 9-63910 | 3/1997 |
| JP | 11 26336 | 1/1999 |
| JP | 11-233476 | 8/1999 |
| JP | 2005 197524 | 7/2005 |
| JP | 2006-080314 | 3/2006 |

(Continued)

OTHER PUBLICATIONS

English language Abstract of JP 11-26336.

(Continued)

*Primary Examiner* — David Vu
*Assistant Examiner* — Jonathan Han
(74) *Attorney, Agent, or Firm* — Greenblum & Bernstein, P.L.C.

(57) ABSTRACT

The present invention provides a method of manufacturing a bonded wafer. The method includes ozone washing two silicon wafers to form an oxide film equal to or less than 2.2 nm in thickness on each surface of the two silicon wafers, and bonding the two silicon wafers through the oxide films formed to obtain a bonded wafer.

9 Claims, 1 Drawing Sheet

Dots represent generations of local oxide.

(56) References Cited

FOREIGN PATENT DOCUMENTS

| JP | 2006-278893 | 10/2006 |
|---|---|---|
| JP | 2007-027475 | 2/2007 |
| WO | 97/41590 | 11/1997 |

OTHER PUBLICATIONS

English language Abstract of JP 2005-197524.
U.S. Appl. No. 11/851,065 to Nishihata et al, filed Sep. 6, 2007.
U.S. Appl. No. 11/957,674 to Okuda et al., filed Dec. 17, 2007.
Japanese Office Action issued with respect to counterpart Japanese Application No. 2007-064482, dated Sep. 4, 2012 with English excerpt.
E.P.O. Office action, mail date is Mar. 25, 2013.
Japan Office action, mail date is Mar. 12, 2013, with English language excerpt.
Search report from E.P.O. that issued with respect to patent family member European Patent Application No. 07024471.0, mailing date is May 19, 2011.
European Office Action in regard to European Application No. 07024471.0, dated Apr. 7, 2014.

\* cited by examiner

Generation of local oxide cannot be observed.

Dots represent generations of local oxide.

METHOD OF MANUFACTURING BONDED WAFER

CROSS-REFERENCE TO RELATED APPLICATIONS

This application claims the benefit of priority under 35 USC 119 to Japanese Patent Application No. 2007-064482 filed on Mar. 14, 2007, which is expressly incorporated herein by reference in its entirety.

BACKGROUND OF THE INVENTION

1. Field of the Invention

The present invention relates to a method of manufacturing a bonded wafer. More specifically, the present invention relates to a method of manufacturing a bonded wafer having an oxide film with an uniform thickness of about a few nanometers.

2. Discussion of the Background

When bonding two silicon wafers through an oxide film to manufacture a bonded wafer, the oxide film is normally formed by heat treatment under an oxygen gas atmosphere and the formed oxide film usually has a thickness of equal to or greater than 100 nm. Such a manufacturing method is described, for example, in Japanese Unexamined Patent Publication (KOKAI) Heisei No. 11-26336, which is expressly incorporated herein by reference in its entirety.

However, the thickness of an oxide film that functions as a BOX layer has become thinner with the miniaturization of devices and reduction of electric power consumption. Furthermore, directly bonded wafers without a BOX layer have been developed. However, it is difficult to uniformly form an oxide film with a thickness of about a few nanometers using conventional heat treatment methods. In particular, when a batch-type heat treatment furnace is employed, a load lock-type transfer equipment, an equipment for providing an ozone gas, and the like are required, resulting in increase in manufacturing costs.

An oxide film formed on a silicon surface by heat treatment is made of silicon oxide, $SiO_2$. Since the oxide film made of $SiO_2$ is a stable film, such an oxide film does not diffuse outward and thus it is condensed or becomes smaller during subsequent manufacturing process (heat treatment process). Finally, it remains as local oxide on an interface (that may be referred to as "bonding interface", hereinafter) through which two silicon wafers are bonded. As a result, there may be a risk that problems such as failure of device formation and deteriorated characteristics occur. Such problems are caused by an oxide that is present on the bonding interface has not diffused completely outward and remains on the interface.

The aforementioned heat treatment is conducted, for example, to increase the strength of the interface through which two silicon wafers are bonded, to increase the surface flatness, and the like. For example, in the heat treatment conducted for increasing the strength of bonding interface, the bonded wafer is kept at a temperature of equal to or higher than 1,100° C. for equal to or longer than 1 hour. Examples of the heat treatment for increasing the surface flatness include a heat treatment conducted with argon, hydrogen gas, and the like at a temperature of equal to or higher than 1,100° C. Such heat treatment is described, for example, in Japanese Unexamined Patent Publication (KOKAI) No. 2005-197524 or English language family member US Patent Application Publication No. 2007/0190737 A1, which are expressly incorporated herein by reference in their entirety.

When two wafers are bonded through no oxide film, the wafers are bonded following usual cleaning such as SC1. However, in that case, an oxide film with a thickness of equal to or greater than 2 nm is formed on the silicon wafer after conducting conventional cleaning, and local oxide remains on the bonding interface by the heat treatment during bonding process.

SUMMARY OF THE INVENTION

An aspect of the present invention provides for a method of manufacturing a bonded wafer in which no local oxide remains on a bonding interface following heat treatment in bonding process.

The present inventors conducted extensive research for achieving the above manufacturing method. As a result, they discovered that generation of local oxide, that is generated during manufacturing process (heat treatment) of a bonded wafer, can be inhibited by forming an oxide film on a silicon surface by ozone water treatment in a thickness equal to or less than 2.2 nm when two silicon wafers are directly bonded. The present invention was devised on that basis. The oxide film formed by ozone washing tends to be decomposed by heat treatment in the subsequent process more easily than the oxide film formed by heat treatment. Therefore, it is believed that such oxide film can be diffused without occurrence of local concentration of the oxide film by heat treatment in the bonding process, and thus generation of local oxide on the bonding interface can be inhibited. The discovery in that the oxide film formed by ozone washing tends to be decomposed by heat treatment in the subsequent process more easily than the oxide film formed by heat treatment is a novel discovery that has been previously unknown.

An aspect of the present invention relates to a method of manufacturing a bonded wafer comprising:

ozone washing two silicon wafers to form an oxide film equal to or less than 2.2 nm in thickness on each surface of the two silicon wafers, and bonding the two silicon wafers through the oxide films formed to obtain a bonded wafer.

The bonded wafer may comprise no local oxide on an interface through which the two silicon wafers are bonded.

In the ozone washing, ozone water with an ozone concentration ranging from 1 to 50 ppm may be employed.

The method may further comprise removing a natural oxide film on at least one surface of the two silicon wafers prior to the ozone washing.

The method may further comprise conducting plasma treatment following the oxide film forming and prior to the bonding.

The plasma treatment may be conducted with nitrogen, oxygen, argon, diluted hydrogen or a mixture thereof.

The bonding may be conducted by heat treatment at a temperature of equal to or higher than 1,000° C.

The method may further comprise thinning the bonded wafer obtained.

The thinning may be conducted by grinding and polishing, or ion-implantation separation.

According to the present invention, the method of manufacturing a bonded wafer, in which generation of local oxide that is generated during manufacturing process (heat treatment) of a bonded wafer can be inhibited, can be provided.

Other exemplary embodiments and advantages of the present invention may be ascertained by reviewing the present disclosure and the accompanying drawings.

BRIEF DESCRIPTION OF THE DRAWINGS

The present invention will be described in the following text by the exemplary, non-limiting embodiments shown in the figures, wherein.

DESCRIPTIONS OF THE EMBODIMENTS

Figure 1:
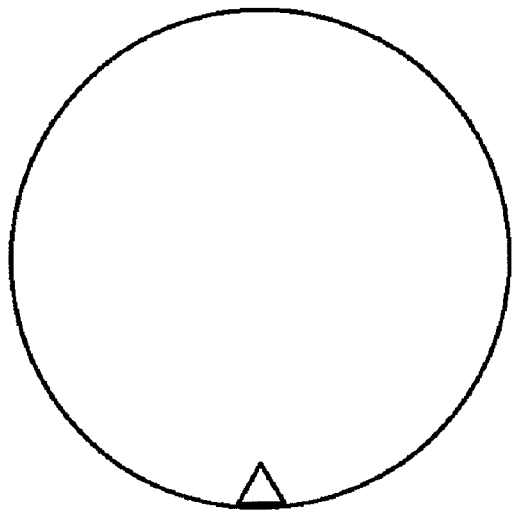
FIG. 1 is an explanatory drawing of results of a visual inspection of the surface of the bonded wafers of Examples 1 to 8. Generation of local oxide cannot be observed.

The following preferred specific embodiments are, therefore, to be construed as merely illustrative, and non-limiting to the remainder of the disclosure in any way whatsoever. In this regard, no attempt is made to show structural details of the present invention in more detail than is necessary for fundamental understanding of the present invention; the description taken with the drawings makes apparent to those skilled in the art how several forms of the present invention may be embodied in practice.

The present invention relates to a method of manufacturing a bonded wafer. The method of manufacturing a bonded wafer of the present invention can provide a bonded wafer comprising no local oxide on an interface through which two silicon wafers are bonded.

The method of manufacturing a bonded wafer of the present invention comprises ozone washing two silicon wafers to form an oxide film equal to or less than 2.2 nm in thickness on each surface of the two silicon wafers, and bonding the two silicon wafers through the oxide films formed to obtain a bonded wafer.

In the oxide film formation, the oxide film equal to or less than 2.2 nm in thickness can be formed on the surfaces of the two silicon wafers by ozone washing the silicon wafers. When the thickness of the oxide film formed is greater than 2.2 nm, generation of local oxide on the bonding surface cannot be inhibited. The oxide film formed by ozone washing can be decomposed by heat treatment in the subsequent process more easily than the oxide film formed by heat treatment. Therefore, it can be diffused without occurrence of local concentration of the oxide film by heat treatment in the bonding process. However, even though the oxide film is formed by ozone washing, it is not possible to diffuse the oxide film completely by heat treatment in the process of manufacturing bonded wafer when the thickness thereof exceeds 2.2 nm, resulting in a local concentration of the oxide film remaining on the bonding interface. In contrast, the lower limit of thickness of the oxide film formed is, for example, 0.5 nm. It is not easy to control the formation of oxide film when the thickness of the oxide film is less than 0.5 nm. The oxide film equal to or greater than 0.5 nm in thickness can serve as an oxide sufficiently film in bonding.

The film thickness of the oxide film formed on the silicon wafer surface can be measured by using ellipsometry. Ellipsometry is a method in which the film thickness of the oxide film is measured by irradiating a polarized light on a flat surface of a sample and measuring the change in the polarized right state of the reflected light to obtain a refractive index of the sample.

In the present invention, two silicon wafers are ozone washed to form an oxide film equal to or less than 2.2 nm in thickness on the surfaces of the silicon wafers. Ozone water having an ozone concentration ranging from 1 to 50 ppm is suitable for use in the ozone washing. It may take too long time to form an oxide film with a desired thickness when using ozone water having an ozone concentration of less than 1 ppm. Strict time control may be required for the formation of an oxide film equal to or less than 2.2 nm in thickness when using ozone water having an ozone concentration of greater than 50 ppm. The ozone concentration of ozone water employed preferably ranges from 5 to 40 ppm, more preferably from 10 to 30 ppm.

Time for ozone washing can be suitably set in view of the thickness of oxide film formed, the ozone concentration of ozone water employed, and the like. The ozone washing can be conducted, for example, for 10 seconds to 10 minutes, preferably 30 seconds to 5 minutes. However, the present invention is not limited to the above range.

The ozone washing can be conducted by using a batch-type washing machine equipped with a device for providing pure water containing a certain concentration of ozone, $O_3$, or single-wafer type washing machine. The ozone washing can be conducted at room temperature (for example, at a temperature of 10 to 30° C., preferably 15 to 25° C.) without heating ozone water.

Using ozone washing, the oxide film can be formed, and in addition to the oxide film formation, organic substances present on the silicon wafer surface can be removed. Accordingly, defects such as voids that are generated in bonding and caused by organic substances can be inhibited by the ozone washing. In the same manner, generation of voids and/or blisters can be inhibited when thinning the wafer is conducted by ion-implantation separation.

Prior to the ozone washing, a natural oxide film can be removed from one or both surfaces of the silicon wafers, and then the silicon wafers can be subjected to the ozone washing. The natural oxide film is formed during final washing of the silicon wafer and the subsequent storage period in the atmosphere. The thickness of the natural oxide film varies depending on the condition of final washing and the state of storage. Therefore, when the natural oxide film greater than 2.2 nm in thickness has been formed on the surface of the silicon wafer, it is appropriate to remove the natural oxide film. The natural oxide film can be removed by HF (hydrogen fluoride) treatment. The HF treatment can be conducted, for example, by immersing the silicon wafer in HF solution that has been diluted to 1 percent for 5 minutes in a batch-type washing machine. The natural oxide film can be removed completely by such HF treatment. In such HF treatment, the HF concentration, the type (batch type or single-wafer type) of the washing machine employed are not specifically limited. Any method can be employed as long as the natural oxide film can be completely removed.

After forming the oxide film, the two silicon wafers are bonded through the oxide film formed to obtain a bonded wafer. The bonded wafer can be obtained by bonding the two silicon wafers through the oxide film formed and then conducting heat treatment at a temperature of equal to or higher than 1,000° C. to increase the adhesive strength. In the method of manufacturing, generation of local oxide on the bonding interface can be inhibited by bonding the two silicon wafers comprising an oxide film equal to or less than 2.2 nm in thickness on each surface that has been formed by ozone washing and then conducting the above heat treatment. The temperature of the above heat treatment is appropriately equal to or higher than 1,000° C. At less than 1,000° C., adequate bonding strength may not be obtained, sometimes resulting in defects such as exfoliation in the thinning process and device manufacturing process. In addition, in the high-temperature region, especially at higher than 1,200° C., slip lines sometimes occur. The temperature ranging from 1,050 to 1,150° C. is preferred. As for the time, the heat treatment is suitably conducted for equal to or longer than 30 minutes. In the heat treatment of less than 30 minutes, defects such as those mentioned above sometimes occur. The atmosphere of the heat treatment can be argon gas atmosphere the atmosphere in which oxygen gas and nitrogen gas are mixed together. However, the present invention is not limited thereto.

Following the oxide film formation, the silicon wafer can be subjected to plasma treatment prior to bonding, after which the bonding can be conducted. Organic substances adhering to the silicon wafer surface can be removed by subjecting the silicon wafer surface to plasma treatment prior to bonding, permitting improvement of the percent defective of void defect. Furthermore, using plasma treatment, the surface can be activated. Thus, the temperature of the heat treatment that is conducted for increasing the bonding strength can be lowered, permitting the reduction of the manufacturing cost through shortening of throughput. The plasma treatment can be conducted with nitrogen, oxygen, argon, diluted hydrogen or a mixture of two or more of the above gases, for example. The method of the plasma treatment can be the method in which the inside of a plasma chamber into which a wafer has been placed is completely replaced with a certain gas (for example, nitrogen gas) and then plasma is generated for a few ten seconds to a few minutes while reducing the internal pressure of the plasma chamber to, for example 0.1 kPA to activate the wafer surface. However, the present invention is not limited thereto.

According to the above method, direct bonding of two silicon wafers of which crystal orientations are different from each other can be easily carried out, such as the direct bonding of the silicon wafer having the crystal orientation (110) and having the crystal orientation (100) and the direct bonding of the silicon wafer having the crystal orientation (111) and having the silicon wafer (100).

The method of manufacturing of the present invention can further comprise thinning of the bonded wafer. The thinning can be conducted by grinding and polishing, or ion-implantation separation. For example, the ion-implantation separation can be carried out as follows. Hydrogen ions or rare gas ions are implanted into a silicon wafer prior to the oxide film formation to prepare the silicon wafer that is to be an active layer. The oxide film is formed on the silicon wafer and then a bonded wafer is prepared. Thereafter, the bonded wafer is thinned. Implantation of hydrogen ions can be carried out at an accelerating voltage of 50 keV and dose amount of 1e17/cm$^2$. According to such a method, a silicon wafer 300 mm in diameter that is to be an active layer can be formed. As for the manufacturing method of a silicon wafer comprising ion-implantation separation, Japanese Unexamined Patent Publication (KOKAI) No. 2005-197524 or English language family member US Patent Application Publication No. 2007/0190737 A1 can be referred to.

EXAMPLES

The present invention will be described in detail below based on examples. However, the present invention is not limited to the examples.

Example 1

Two silicon wafers 300 mm in diameter were immersed in ozone ($O_3$) water (room temperature) with an ozone concentration of 30 ppm for 2 minutes with a batch-type washing machine to for an oxide film 2.0 nm in thickness. The thickness of the oxide film was measured and confirmed by ellipsometry. After forming the oxide film, two silicon wafers were directly bonded. To increase the bonding strength, the heat treatment was conducted at 1,100° C. for 2 hours in an argon gas atmosphere. Furthermore, the wafer of the active later side was grinded and polished to a prescribed thickness to prepare a bonded wafer. Thereafter, the surface of the bonded wafer was visually inspected. As a result, it was confirmed that no local oxide was generated on the bonding interface, see FIG. 1.

Example 2

Hydrogen ions were implanted at an accelerating voltage of 50 keV and a dose amount of 1e17/cm$^2$ into the silicon wafer 300 mm in diameter that was to be an active layer. The above silicon wafer was processed by the same method and condition as those in Example 1 to form an oxide film 2.0 nm in thickness. The thickness of the oxide film was measured and confirmed by ellipsometry. Another silicon wafer that had not been subjected to the hydrogen ion implantation was processed by the same method and condition as those in Example 1 to form an oxide film 2.0 nm in thickness. The thickness of the oxide film was measured and confirmed by ellipsometry. The silicon wafer was employed as a support side wafer and bonded with the aforementioned wafer that was to be an active layer. Then, the heat treatment at 500° C. was conducted to separate a portion of the wafer at the ion implantation layer as boundary to prepare a bonded wafer. To increase the bonding strength, the heat treatment was conducted at 1,100° C. for 2 hours in an argon gas atmosphere. Furthermore, the wafer of the active later side was polished to a prescribed thickness. Thereafter, the surface of the bonded wafer was visually inspected. As a result, it was confirmed that no local oxide was generated on the bonding interface, see FIG. 1.

Example 3

Two silicon wafers 300 mm in diameter were washed with HF to completely remove a natural oxide film. Then, the two silicon wafers were processed by the same method and condition as those in Example 1 to form an oxide film 2.0 nm in thickness. Thereafter, a bonded wafer was prepared by the same method as that in Example 1. The surface of the bonded wafer thus prepared was visually inspected. As a result, it was confirmed that no local oxide was generated on the bonding interface, see FIG. 1.

Example 4

Two silicon wafers 300 mm in diameter were processed by the same method and condition as those in Example 1 to form an oxide film 2.0 nm in thickness. The thickness of the oxide film was measured and confirmed by ellipsometry. Thereafter, the two silicon wafers were subjected to plasma treatment in a nitrogen gas atmosphere at 25 Pa for 20 seconds, and then directly bonded. To increase the bonding strength, the heat treatment was conducted at 1,100° C. for 2 hours in an argon gas atmosphere. Furthermore, the wafer of the active later side was grinded and polished to a prescribed thickness to prepare a bonded wafer. Thereafter, the surface of the bonded wafer thus prepared was visually inspected. As a result, it was confirmed that no local oxide was generated on the bonding interface, see FIG. 1.

Example 5

Two silicon wafers 300 mm in diameter were immersed in ozone ($O_3$) water (room temperature) with an ozone concentration of 10 ppm for 1 minute with a batch-type washing machine to for an oxide film 0.5 nm in thickness. The thickness of the oxide film was measured and confirmed by ellipsometry. After forming the oxide film, two silicon wafers were directly bonded. To increase the bonding strength, the heat treatment was conducted at 1,100° C. for 2 hours in an argon gas atmosphere. Furthermore, the wafer of the active later side was grinded and polished to a prescribed thickness to prepare a bonded wafer. Thereafter, the surface of the bonded wafer was visually inspected. As a result, it was confirmed that no local oxide was generated on the bonding interface, see FIG. 1.

Example 6

Hydrogen ions were implanted at an accelerating voltage of 50 keV and a dose amount of 1e17/cm$^2$ into the silicon wafer 300 mm in diameter that was to be an active layer. The above silicon wafer was processed by the same method and condition as those in Example 5 to form an oxide film 0.5 nm in thickness. The thickness of the oxide film was measured and confirmed by ellipsometry. Another silicon wafer that had not been subjected to the hydrogen ion implantation was processed by the same method and condition as those in Example 5 to form an oxide film 0.5 nm in thickness. The thickness of the oxide film was measured and confirmed by ellipsometry. The silicon wafer was employed as a support side wafer and bonded with the aforementioned wafer that was to be an active layer. Then, the heat treatment at 500° C. was conducted to separate a portion of the wafer at the ion implantation layer as boundary to prepare a bonded wafer. To increase the bonding strength, the heat treatment was conducted at 1,100° C. for 2 hours in an argon gas atmosphere. Furthermore, the wafer of the active layer side was polished to a prescribed thickness. Thereafter, the surface of the bonded wafer was visually inspected. As a result, it was confirmed that no local oxide was generated on the bonding interface, see FIG. 1.

Example 7

Two silicon wafers 300 mm in diameter were washed with HF to completely remove a natural oxide film. Then, the two silicon wafers were processed by the same method and condition as those in Example 5 to form an oxide film 0.5 nm in thickness. Thereafter, a bonded wafer was prepared by the same method as that in Example 1. The surface of the bonded wafer thus prepared was visually inspected. As a result, it was confirmed that no local oxide was generated on the bonding interface, see FIG. 1.

Example 8

Two silicon wafers 300 mm in diameter were processed by the same method and condition as those in Example 5 to form an oxide film 0.5 nm in thickness. The thickness of the oxide film was measured and confirmed by ellipsometry. Thereafter, the two silicon wafers were subjected to plasma treatment in a nitrogen gas atmosphere at 25 Pa for 20 seconds, and then directly bonded. To increase the bonding strength, the heat treatment was conducted at 1,100° C. for 2 hours in an argon gas atmosphere. Furthermore, the wafer of the active later side was grinded and polished to a prescribed thickness to prepare a bonded wafer. Thereafter, the surface of the bonded wafer thus prepared was visually inspected. As a result, it was confirmed that no local oxide was generated on the bonding interface, see FIG. 1.

Comparative Example 1

Figure 2:
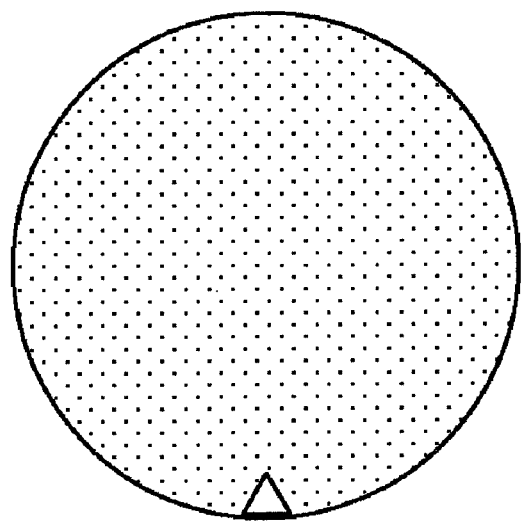
FIG. 2 is an explanatory drawing of results of visual inspection of the surface of the bonded wafers of Comparative Examples 1 and 2. Generations of local oxide (represented as dots) can be observed.

Two silicon wafers 300 mm in diameter were immersed in ozone ($O_3$) water (room temperature) with an ozone concentration of 30 ppm for 2.5 minutes with a batch-type washing machine to for an oxide film 2.5 nm in thickness. The thickness of the oxide film was measured and confirmed by ellipsometry. After forming the oxide film, two silicon wafers were directly bonded. To increase the bonding strength, the heat treatment was conducted at 1,100° C. for 2 hours in an argon gas atmosphere. Furthermore, the wafer of the active layer side was grinded and polished to a prescribed thickness to prepare a bonded wafer. Thereafter, the surface of the bonded wafer was visually inspected. As a result, it was confirmed that local oxides were generated on the bonding interface (see FIG. 2).

Comparative Example 2

Two silicon wafers 300 mm in diameter were heat treated for 10 minutes in a vertical furnace in which the temperature was 700° C. and 1% of oxygen and 99% of nitrogen were mixed to form an oxide film 2 nm in thickness, and then directly bonded. Then, a bonded wafer was prepared by the same method as that in Example 1. Thereafter, the surface of the bonded wafer was visually inspected. As a result, it was confirmed that local oxides were generated on the bonding interface (see FIG. 2).

The present invention is useful in the field of manufacturing bonded wafers.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any embodiments thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

Unless otherwise stated, a reference to a compound or component includes the compound or component by itself, as well as in combination with other compounds or components, such as mixtures of compounds.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

What is claimed is:

1. A method of manufacturing a bonded wafer comprising:
   ozone washing two silicon wafers to form an oxide film equal to or less than 2.2 nm in thickness on each surface of the two silicon wafers, and
   bonding the two silicon wafers through the oxide films formed to obtain a bonded wafer.

2. The method of manufacturing a bonded wafer of claim 1, wherein heat treatment is conducted in the bonding to decompose the oxide film present at an interface through which the two silicon wafers are bonded and the bonded wafer manufactured comprises no local oxide on the interface.

3. The method of manufacturing a bonded wafer of claim 1, wherein ozone water with an ozone concentration ranging from 1 to 50 ppm is employed in said ozone washing.

4. The method of manufacturing a bonded wafer of claim 1, which further comprises removing a natural oxide film on at least one surface of the two silicon wafers prior to said ozone washing.

5. The method of manufacturing a bonded wafer of claim 1, which further comprises conducting plasma treatment following said oxide film forming and prior to said bonding.

6. The method of manufacturing a bonded wafer of claim 5, wherein said plasma treatment is conducted with nitrogen, oxygen, argon, diluted hydrogen or a mixture thereof.

7. The method of manufacturing a bonded wafer of claim 1, wherein said bonding is conducted by heat treatment at a temperature of equal to or higher than 1,000° C.

8. The method of manufacturing a bonded wafer of claim 1, which further comprises thinning the bonded wafer obtained.

9. The method of manufacturing a bonded wafer of claim 8, wherein said thinning is conducted by grinding and polishing, or ion-implantation separation.

* * * * *